(12) United States Patent
Tian et al.

(10) Patent No.: US 10,851,458 B2
(45) Date of Patent: Dec. 1, 2020

(54) CONNECTOR FOR SUBSTRATE SUPPORT WITH EMBEDDED TEMPERATURE SENSORS

(71) Applicant: Lam Research Corporation, Fremont, CA (US)

(72) Inventors: Siyuan Tian, Fremont, CA (US); Donald J. Miller, Hayward, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 235 days.

(21) Appl. No.: 15/936,990

(22) Filed: Mar. 27, 2018

(65) Prior Publication Data

US 2019/0301017 A1   Oct. 3, 2019

(51) Int. Cl.
| | | |
|---|---|---|
| *B23P 19/00* | (2006.01) | |
| *C23C 16/46* | (2006.01) | |
| *C23C 16/458* | (2006.01) | |
| *G01K 7/00* | (2006.01) | |

(52) U.S. Cl.
CPC .......... *C23C 16/46* (2013.01); *C23C 16/4583* (2013.01); *G01K 7/00* (2013.01)

(58) Field of Classification Search
CPC .......... H01L 21/6831; H01L 21/67103; H01L 21/21; H02N 13/00; B23B 31/28
See application file for complete search history.

(56) References Cited

U.S. PATENT DOCUMENTS

| | | | | |
|---|---|---|---|---|
| 2009/0139448 A1* | 6/2009 | Hirata | ................. | C23C 16/4584 117/107 |
| 2010/0024981 A1* | 2/2010 | Wallace | ............ | H01L 21/67248 156/345.27 |
| 2013/0168379 A1* | 7/2013 | Deenen | ................... | B23P 11/00 219/443.1 |
| 2013/0284374 A1* | 10/2013 | Lubomirsky | ..... | H01L 21/67109 156/345.51 |

(Continued)

FOREIGN PATENT DOCUMENTS

| | | |
|---|---|---|
| JP | 2011222931 A | 11/2011 |
| WO | WO-2017188189 A1 | 11/2017 |

OTHER PUBLICATIONS

International Search Report and Written Opinion for PCT Application No. PCT/US2019/022702 dated Jun. 26, 2019.

*Primary Examiner* — Lee D Wilson

(57) ABSTRACT

A substrate support for a plasma system includes a first layer being made of a ceramic and having a first surface and a second surface opposite the first surface. The first layer is configured to support a substrate on the first surface during processing. A thermal heating element is embedded within the ceramic. A temperature sensor that is embedded within the ceramic. Electrically conductive pads are: electrically connected to the temperature sensor via first wires embedded in the ceramic; and formed on the second surface of the first layer. A second layer includes a through hole through the second layer. A connector extends through the through hole and that includes: a retainer; and electrical conductors (Continued)

that are held by the retainer and that include: first ends that are electrically connected to the electrically conductive pads, respectively; and second ends that are electrically connected to a temperature controller by wire.

18 Claims, 11 Drawing Sheets

(56) References Cited

U.S. PATENT DOCUMENTS

| | | | |
|---|---|---|---|
| 2015/0348809 A1* | 12/2015 | Iu | H01L 21/67115 392/416 |
| 2016/0056032 A1* | 2/2016 | Baldasseroni | C23C 16/45572 438/778 |
| 2016/0329231 A1* | 11/2016 | Parkhe | H05B 1/023 |
| 2020/0010951 A1* | 1/2020 | Jakob | C23C 16/042 |

* cited by examiner

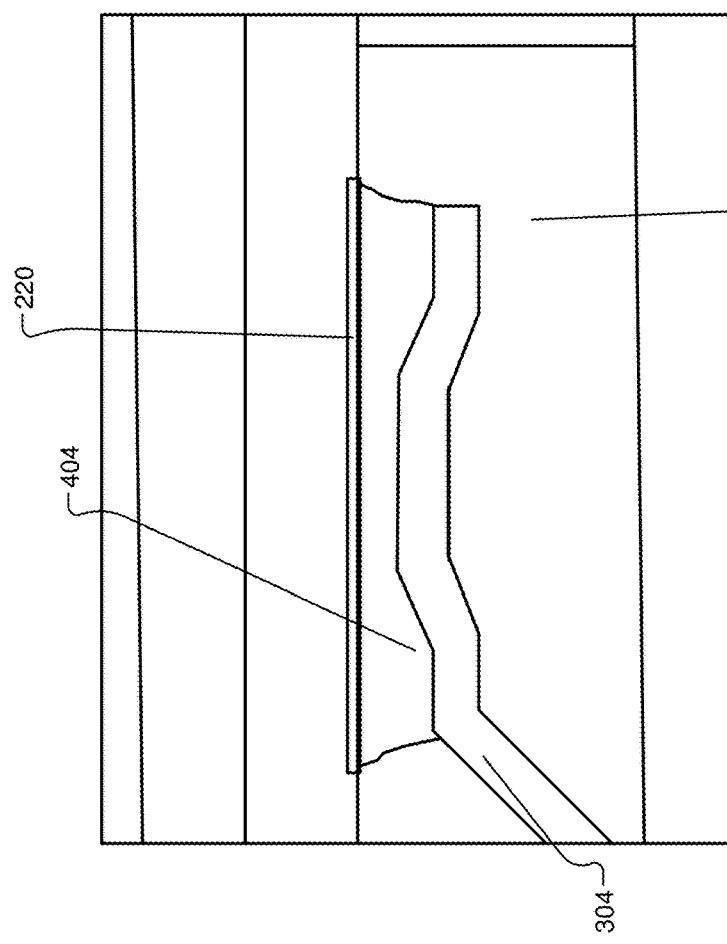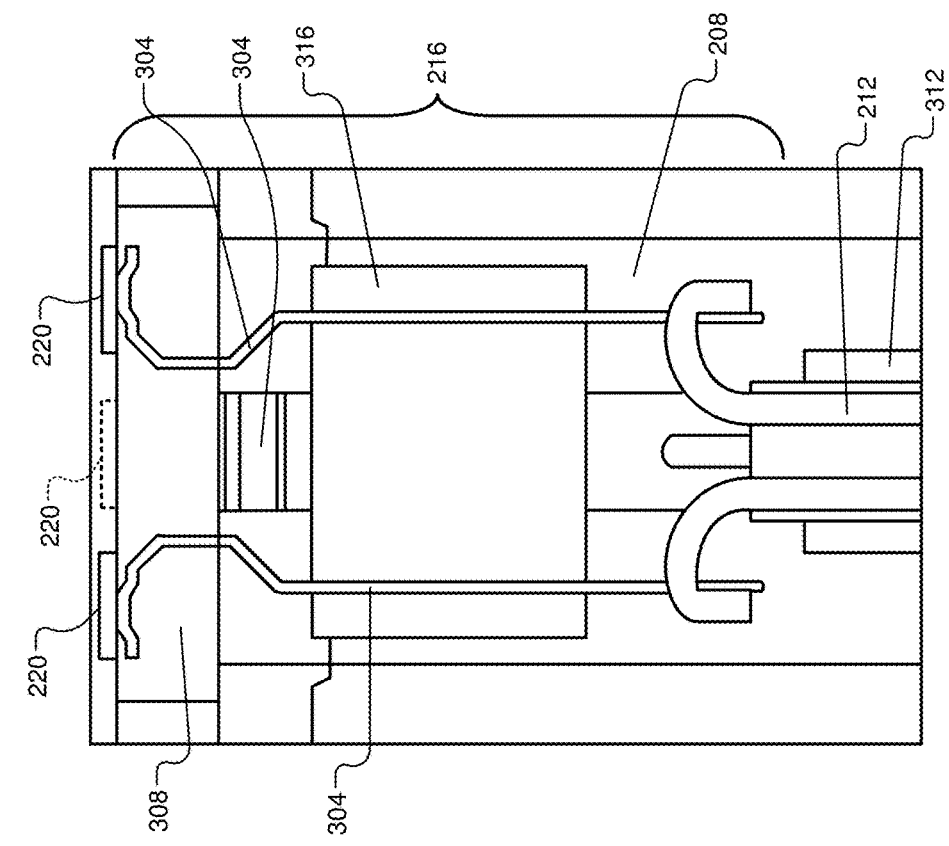

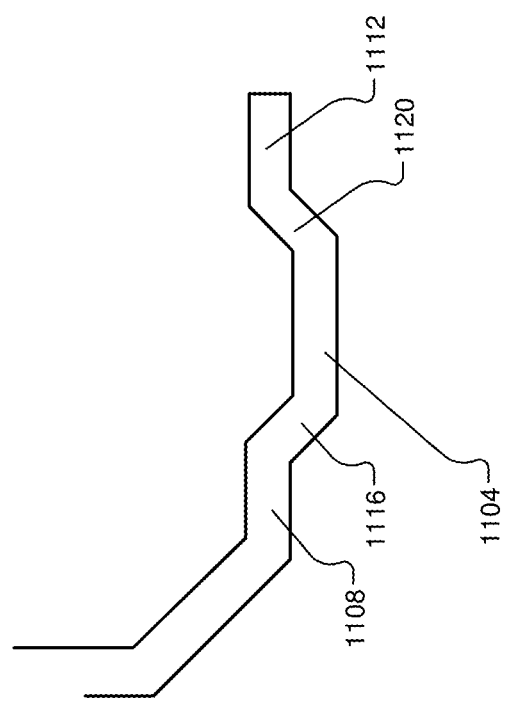

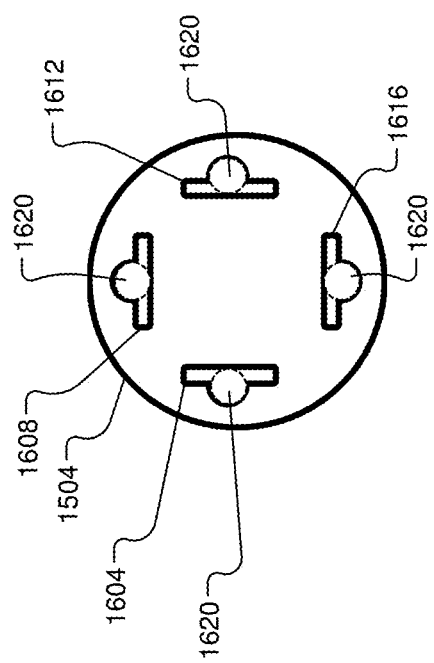
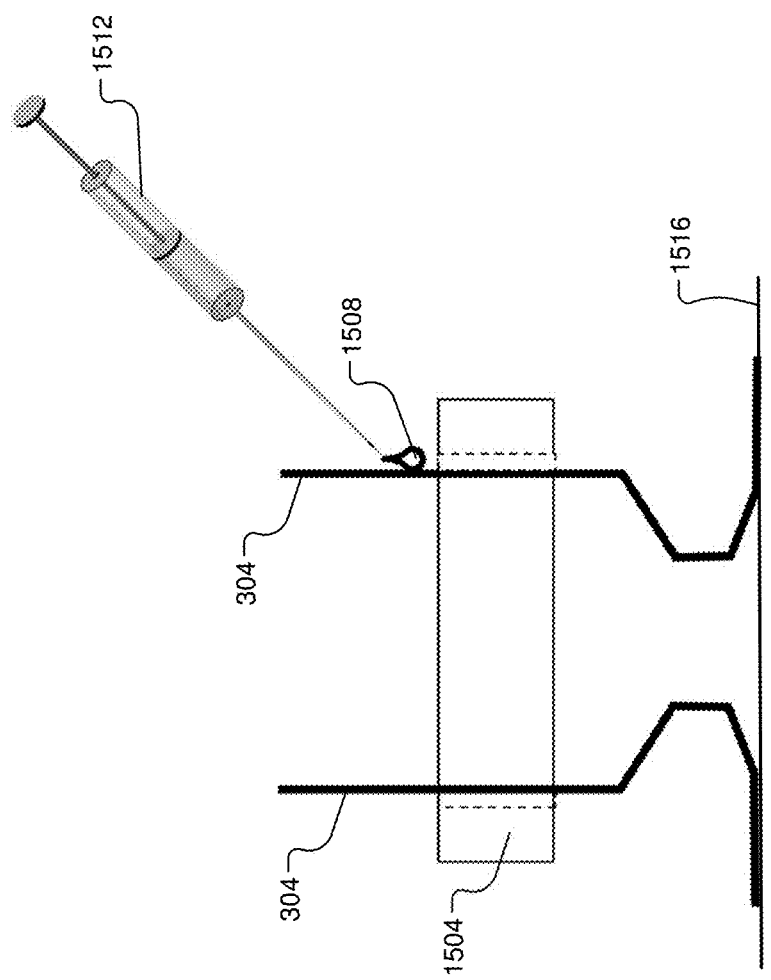
FIG. 16
FIG. 15

CONNECTOR FOR SUBSTRATE SUPPORT WITH EMBEDDED TEMPERATURE SENSORS

FIELD

The present disclosure relates to substrate supports of processing chambers, and more particularly to devices connecting temperature sensors of substrate supports with a temperature controller.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures may be introduced into the processing chamber and plasma may be used to initiate chemical reactions.

The substrate support may include a ceramic layer arranged to support a substrate. For example, the wafer may be clamped to the ceramic layer during processing. The substrate support may include an edge ring arranged around an outer portion (e.g., outside of and/or adjacent to a perimeter) of the substrate support. The edge ring may be provided to confine plasma to a volume above the substrate, protect the substrate support from erosion caused by the plasma, etc.

SUMMARY

In a feature, a substrate support for a plasma system is described. The substrate support includes a first layer being made of a ceramic and having a first surface and a second surface opposite the first surface. The first layer is configured to support a substrate on the first surface during processing. A thermal heating element is embedded within the ceramic. A temperature sensor that is embedded within the ceramic. Electrically conductive pads are: electrically connected to the temperature sensor via first wires embedded in the ceramic; and formed on the second surface of the first layer. A second layer includes a through hole through the second layer. A connector extends through the through hole and that includes: a retainer; and electrical conductors that are held by the retainer and that include: first ends that are electrically connected to the electrically conductive pads, respectively; and second ends that are electrically connected to a temperature controller by wire.

In further features, the first ends are electrically connected to the electrically conductive pads, respectively, via reflow soldering.

In further features, the retainer is a single piece.

In further features, the retainer is made of an epoxy.

In further features, the retainer is made of one of silicone, polytetrafluoroethylene (PTFE), polyether ether ketone (PEEK), and a ceramic.

In further features, the retainer includes: a first cylindrical disc; a second cylindrical disc; and a third cylindrical disc. The electrical conductors extend through the first, second, and third cylindrical discs, and the second cylindrical disc is sandwiched between the first and third cylindrical discs.

In further features, an adhesive adheres the electrical conductors to at least one of the first, second, and third cylindrical discs.

In further features: the first cylindrical disc includes first apertures that are separated by a first distance; the second cylindrical disc includes second apertures that are separated by a second distance, where the second distance is either greater than the first distance or less than the first distance; and the third cylindrical disc includes third apertures that are separated by the first distance.

In further features, the first, second, and third cylindrical discs are made of ceramic.

In further features, the first, second, and third cylindrical discs are made of one of an epoxy, silicone, polytetrafluoroethylene (PTFE), and polyether ether ketone (PEEK).

In further features, the first ends are potted within the potting material.

In further features, the first ends of the electrical conductors extend radially outwardly from an axis of the retainer.

In further features a second temperature sensor is embedded within the ceramic, wherein the electrically conductive pads are electrically connected to the second temperature sensor via second wires embedded in the ceramic.

In further features, the temperature sensor is an inter-integrated circuit (I2C) temperature sensor.

In further features: the electrically conductive pads include a first electrically conductive pad, a second electrically conductive pad, a third electrically conductive pad, and a fourth electrically conductive pad. The electrical conductors include: a first electrical conductor that is electrically connected to the first electrically conductive pad via reflow soldering; a second electrical conductor that is electrically connected to the second electrically conductive pad via reflow soldering; a third electrical conductor that is electrically connected to the third electrically conductive pad via reflow soldering; and a fourth electrical conductor that is electrically connected to the fourth electrically conductive pad via reflow soldering.

In further features, the first, second, third, and fourth electrical conductors are rotated 90 degrees from each other.

In further features, the temperature controller is configured to control heating of the thermal heating element based on a temperature measured by the temperature sensor.

In further features, the first ends include first portions that directly contact the electrically conductive pads, respectively, and second portions that are parallel to the first portions and that do not directly contact the electrically conductive pads.

In a feature, an electrical connector includes a first electrical conductor including: a first end configured to be electrically connected to a first electrically conductive pad formed on a surface of a ceramic layer of a substrate support; and a second end configured to be electrically connected to a first wire within a through hole in the substrate support. A second electrical conductor includes: a third end configured to be electrically connected to a second electrically conductive pad formed on the surface of the ceramic layer of the substrate support; and a fourth end configured to be electrically connected to a second wire within the through hole in the substrate support. A third electrical conductor includes: a fifth end configured to be electrically connected to a third electrically conductive pad formed on the surface of the ceramic layer of the substrate support; and a sixth end configured to be electrically connected to a third wire within the through hole in the substrate support. A fourth electrical conductor includes: a seventh end configured to be electrically connected to a fourth electrically conductive pad formed on the surface of the ceramic layer of the substrate support; and an eighth end configured to be electrically connected to a fourth wire within the through hole in the substrate support; and a retainer configured to hold the first, second, third, and fourth electrical conductors in place.

In further features, a plurality of temperature sensors that are embedded within the ceramic layer of the substrate support are connected in parallel and to the first, second, third, and fourth electrically conductive pads.

In further features, the retainer is a single piece.

In further features, the retainer is made of one of an epoxy, silicone, polytetrafluoroethylene (PTFE), polyether ether ketone (PEEK), and ceramic.

In further features, the retainer includes: a first cylindrical disc; a second cylindrical disc; and a third cylindrical disc. The first, second, third, and fourth electrical conductors extend through the first, second, and third cylindrical discs, and the second cylindrical disc is sandwiched between the first and third cylindrical discs.

In further features, an adhesive adheres the first, second, third, and fourth electrical conductors to at least one of the first, second, and third cylindrical discs.

In further features: the first cylindrical disc includes first apertures that are separated by a first distance; the second cylindrical disc includes second apertures that are separated by a second distance, where the second distance is either greater than the first distance or less than the first distance; and the third cylindrical disc includes third apertures that are separated by the first distance.

In further features, the first, second, and third cylindrical discs are made of one of ceramic, an epoxy, silicone, polytetrafluoroethylene (PTFE), and polyether ether ketone (PEEK).

In further features, the first, second, third, and fourth electrical conductors are rotated 90 degrees from each other.

In further features, the first, third, fifth, and seventh ends include first portions configured to directly contact the first, second, third, and fourth electrically conductive pads, respectively, and second portions that are parallel to the first portions and that do not directly contact any of the first, second, third, and fourth electrically conductive pads, respectively.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 includes an example cross-sectional view of a connector and a through hole through a substrate support;

FIG. 4 includes a cross-sectional view illustrating example soldering of a first end of an electrical conductor to an electrically conductive pad resulting from reflow soldering;

FIGS. 10 and 11 include a perspective side view including the first end of the one of the electrical conductors;

FIG. 15 includes a cross-sectional view of electrical conductors and a first retainer disc;

FIG. 16 includes a perspective view of an example retainer disc;

In the drawings, reference numbers may be reused to identify similar and/or identical elements.

DETAILED DESCRIPTION

A substrate support, such as an electrostatic chuck, supports substrates within a substrate processing system. The substrate support includes a ceramic portion upon which substrates sit during processing. A plurality of temperature sensors are embedded within the ceramic portion at a plurality of locations. The temperature sensors measure temperatures at their respective locations.

A plurality of electric heating elements are also embedded within the ceramic portion at a plurality of locations. The temperature sensors communicate the measured temperatures digitally to a temperature controller by wire. Based on the measured temperatures, the temperature controller controls the electric heating elements to achieve target temperatures, respectively.

Wires connecting the temperature sensors with the temperature controller are located within a through hole that extends through the substrate support. The ceramic portion is formed with the embedded temperature sensors connected with electrically conductive pads that are accessible through the through hole. In some examples, the wires may be soldered (e.g., by hand) to the electrically conductive pads to connect the temperature controller with the temperature sensors. Due to thermal stress (e.g., from thermal expansion and contraction), however, soldered connections of the wires to the pads may fail over time. Thus, the temperature controller may become disconnected from the temperature sensors. The entire substrate support and the temperature controller may then be replaced.

According to the present disclosure, first ends of electrical conductors of a connector within the through hole may be reflow soldered to the electrically conductive pads, respectively. The wires are electrically connected (e.g., soldered) to second ends of the electrical conductors of the connector. After the soldering of the electrical conductors to the electrically conductive pads, a potting material may be inserted into the through hole. The potting material may help retain the electrical connection of the first ends of the electrical conductors with the electrically conductive pads.

Figure 1:
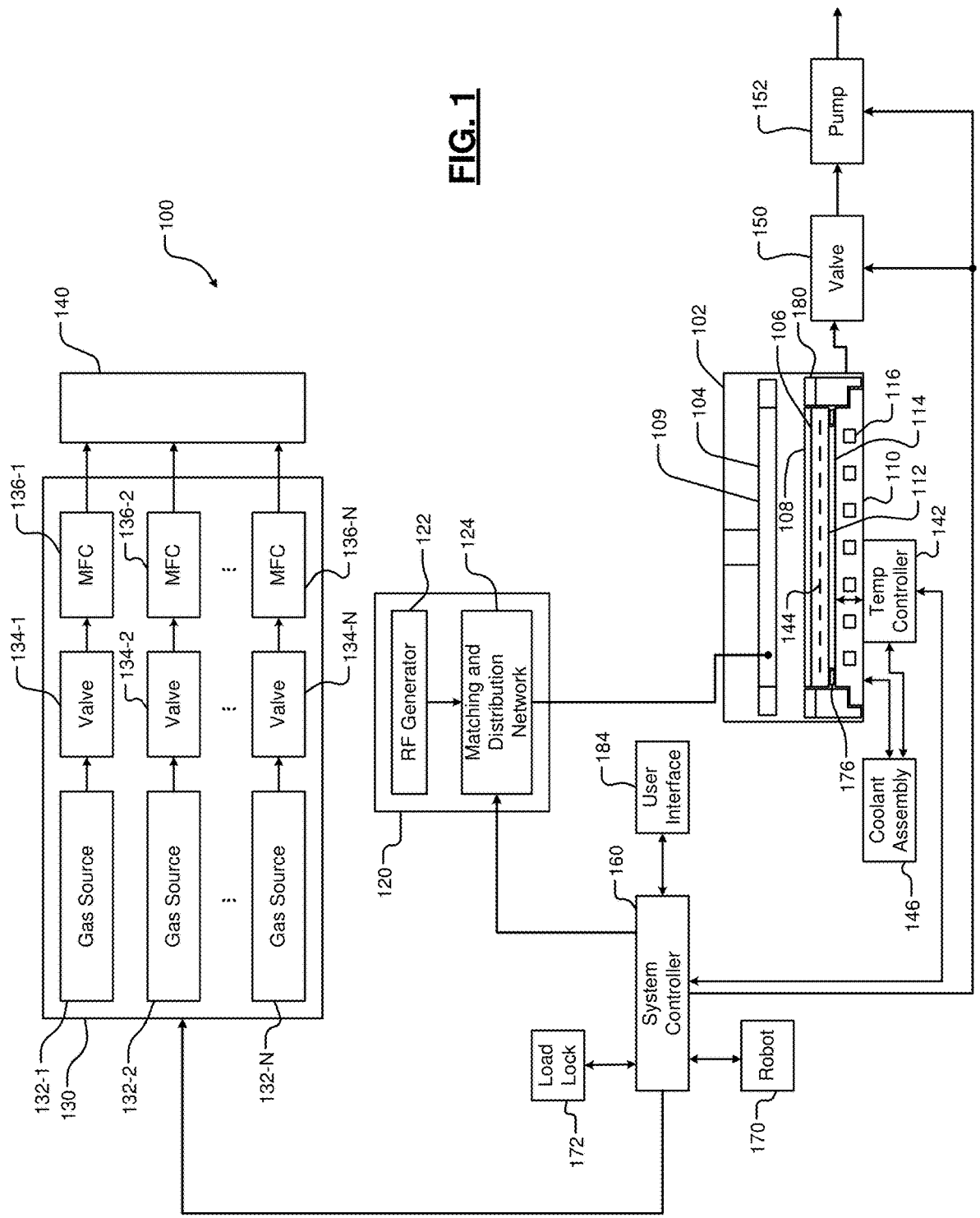
FIG. 1 is a functional block diagram of an example processing chamber.

Referring now to FIG. 1, an example substrate processing system 100 is shown. For example only, the substrate processing system 100 may be used for performing etching using a radio frequency (RF) plasma and/or other suitable substrate processing.

The substrate processing system 100 includes a processing chamber 102 that encloses other components of the substrate processing system 100 and contains the RF plasma. The processing chamber 102 includes an upper electrode 104 and a substrate support 106, such as an electrostatic chuck (ESC). During operation, a substrate 108 is arranged on the substrate support 106. While an example of the substrate processing system 100 and the processing chamber 102 are shown as an example, the present disclosure is also applicable to other types of substrate processing systems and processing chambers, such as a substrate processing system that generates plasma in-situ, that implements remote plasma generation and delivery (e.g., using a plasma tube, a microwave tube), etc.

The upper electrode 104 may include a gas distribution device, such as a showerhead 109, that introduces and distributes process gases. The showerhead 109 may include a stem portion including one end connected to a top surface of the processing chamber 102. A base portion is generally cylindrical and extends radially outwardly from an opposite end of the stem portion at a location that is spaced from the top surface of the processing chamber 102. A substrate-facing surface, or faceplate, of the base portion of the showerhead 109 includes a plurality of holes through which process gas or purge gas flows. Alternately, the upper electrode 104 may include a conducting plate and the process gases may be introduced in another manner.

The substrate support 106 includes an electrically conductive baseplate 110 that acts as a lower electrode. The baseplate 110 supports a ceramic layer 112. A thermal resistance layer 114 (e.g., a bond layer) may be arranged between the ceramic layer 112 and the baseplate 110. The baseplate 110 may include one or more coolant channels 116 for flowing coolant through the baseplate 110. In some examples, a protective seal 176 may be provided around a perimeter of the thermal resistance layer 114 between the ceramic layer 112 and the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded, or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the present disclosure is also applicable to other types of systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources 132 supply one or more etch gases, carrier gases, inert gases, etc., and mixtures thereof. The gas sources 132 may also supply purge gas. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109 and output to the processing chamber 102 from the showerhead 109.

A temperature controller 142 is connected to a plurality of heating elements, such as thermal control elements (TCEs) 144 arranged in the ceramic layer 112. For example, the TCEs 144 may include, but are not limited to, macro heating elements corresponding to respective zones in a multi-zone heating plate and/or an array of micro heating elements disposed across multiple zones of a multi-zone heating plate. The TCEs 144 may be, for example, resistive heaters that generate heat when power is applied to the heaters, respectively, or another suitable type of heating element. The temperature controller 142 controls the TCEs 144 to control temperatures at various locations on the substrate support 106 and the substrate 108.

The temperature controller 142 may communicate with a coolant assembly 146 to control coolant flow through the coolant channels 116. For example, the coolant assembly 146 may include a coolant pump and reservoir. The temperature controller 142 operates the coolant assembly 146 to selectively flow the coolant through the coolant channels 116 to cool the substrate support 106. The temperature controller 142 may control the TCEs 144 together with the coolant assembly 146, for example, to achieve one or more target temperatures.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160.

In some examples, the substrate support 106 includes an edge ring 180. The edge ring 180 may be moveable (e.g., moveable upward and downward in a vertical direction) relative to the substrate 108. For example, movement of the edge ring 180 may be controlled via an actuator responsive to the system controller 160. In some examples, a user may input control parameters to the system controller 160 via a user interface 184, which may include one or more input mechanisms, a display, etc.

Figure 2:
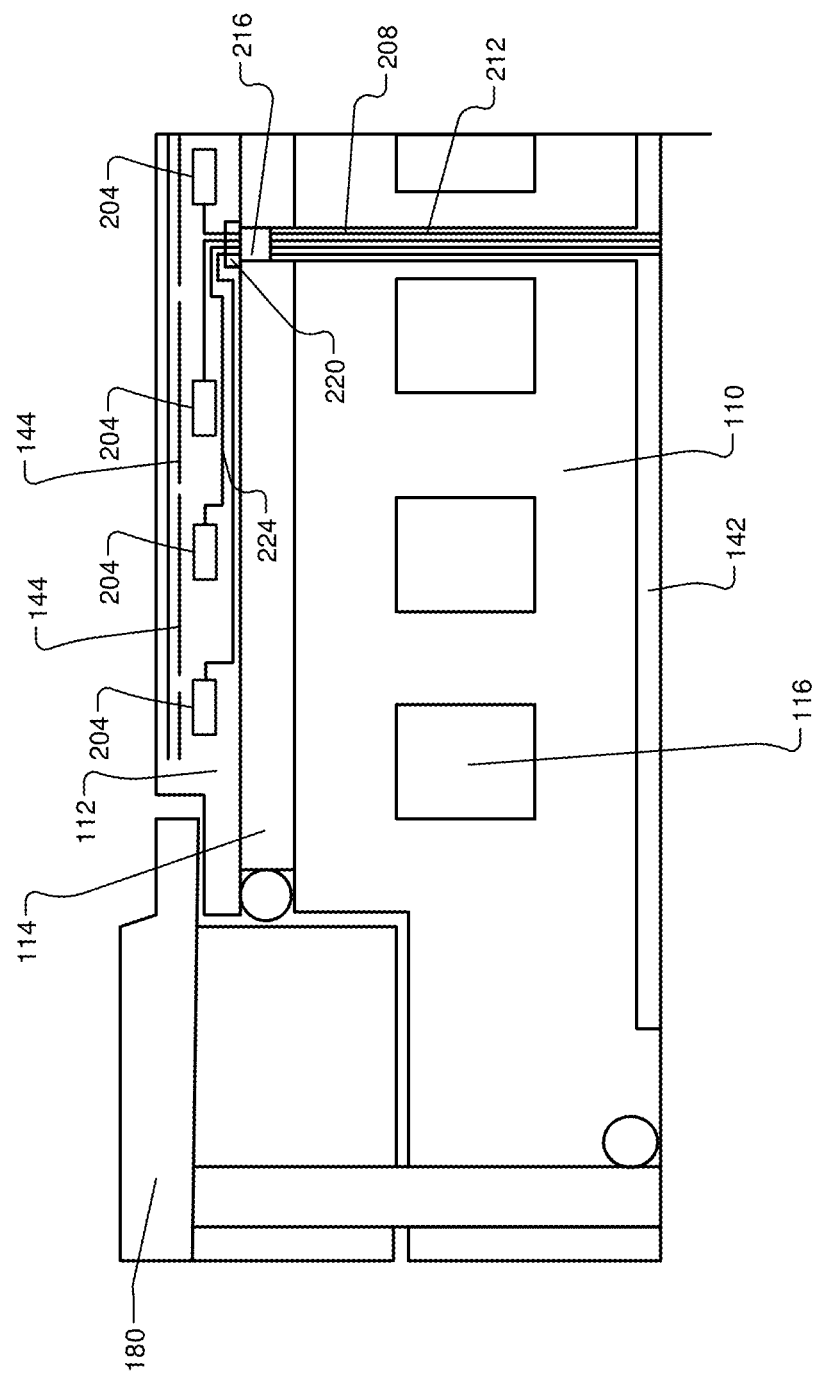
FIG. 2 includes a cross-sectional view of an example portion of a substrate support.

FIG. 2 includes a cross-sectional view of an example portion of the substrate support 106. As shown in FIG. 2, the temperature controller 142 (e.g., including a circuit board and componentry) may be fixed to a bottom of the baseplate 110, opposite the thermal resistance layer 114. A plurality of temperature sensors 204 are embedded in the ceramic layer 112. Each of the temperature sensors 204 is spaced apart from each other one of the temperature sensors 204. For example only, one or more temperature sensors may be provided for each of the TCEs 144. The temperature sensors 204 measure temperatures at their respective locations. In various implementations, the temperature sensors 204 may be inter-integrated circuit (I2C) temperature sensors that communicate with the temperature controller 142 using an I2C protocol.

A through hole 208 is formed through the baseplate 110 and the thermal resistance layer 114. The temperature sensors 204 are electrically connected with the temperature controller 142 via four wires 212 and a connector 216. While the example of one through hole 208 is provided, one or more other through holes may also be formed connecting other temperature sensors embedded in the ceramic layer 112 with the temperature controller 142. Also, while the example of connecting four temperature sensors with the temperature controller 142 through the through hole 208 is provided, a greater or lesser number of temperature sensors 204 may be connected through the through hole 208. For example only, four through holes may be provided in the ceramic layer 112, and four temperature sensors 204 may be connected through each through hole. The through hole 208 may be circular (cylindrical) and have a predetermined through hole diameter.

The temperature sensors 204 are connected (e.g., in parallel) to four electrically conductive pads 220 via wires 224 that are embedded within the ceramic layer 112. A first one of the electrically conductive pads 220 may connect a reference potential to power the temperature sensors 204, and a second one of the electrically conductive pads 220 may connect the temperature sensors 204 to a ground potential. Third and fourth ones of the electrically conductive pads 220 may be connected to the temperature controller 142 for communication with the temperature controller 142. For example, the third one of the electrically conductive pads 220 may communicate signals from the temperature controller 142 to the temperature sensors 204. The fourth one of the electrically conductive pads 220 may communicate signals from the temperature sensors 204 to the temperature controller 142.

FIG. 3 includes an example cross-sectional view of the connector 216 and the through hole 208. Three of the four electrically conductive pads 220 and three of the wires 212 are also shown in FIG. 3. As illustrated in FIG. 3, first ends of electrical conductors 304 of the connector 216 are electrically connected to the electrically conductive pads 220, respectively. The first ends of the electrical conductors 304 may be electrically connected to the electrically conductive pads 220, respectively, via reflow soldering.

Once the first ends of the electrical conductors 304 have been electrically connected (e.g., reflow soldered) to the electrically conductive pads 220, respectively, a potting material 308 may be added. The potting material 308 may improve reliability of the electrical connection of the first ends of the electrical conductors 304 with the electrically conductive pads 220, respectively.

Second ends of the electrical conductors 304 of the connector 216 are electrically connected with the wires 212, respectively. The second ends of the electrical conductors 304 may be electrically connected with the wires 212, respectively, for example, via soldering, reflow soldering, welding, or another via another type of electrically conductive coupling. The electrical conductors 304 may be made of, for example, copper or a copper-tungsten alloy. The electrical conductors 304 may be formed, for example, by molding and/or bending. In various implementations, the wires 212 may be bundled within a sheath 312.

The connector 216 also includes a retainer 316 configured to retain the electrical conductors 304 in positions corresponding to the electrically conductive pads 220. The retainer 316 may be made of, for example, silicone, polytetrafluoroethylene (PTFE), polyether ether ketone (PEEK), ceramic, or an epoxy. The retainer 316 may be formed, for example, by extrusion, machining, potting, or another process.

FIG. 4 includes a cross-sectional view illustrating example soldering 404 of the first end of one of the electrical conductors 304 to one of the electrically conductive pads 220 resulting from reflow soldering.

Figure 6:
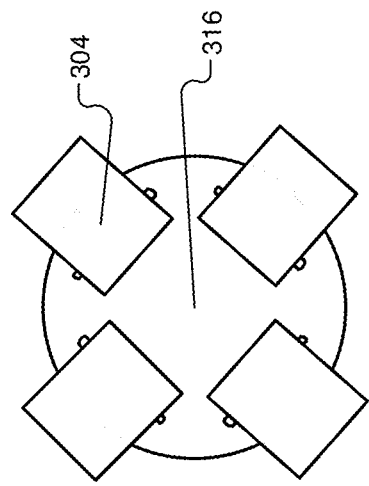
FIG. 6. includes a perspective view toward first ends of electrical conductors of a connector.
Figure 7:
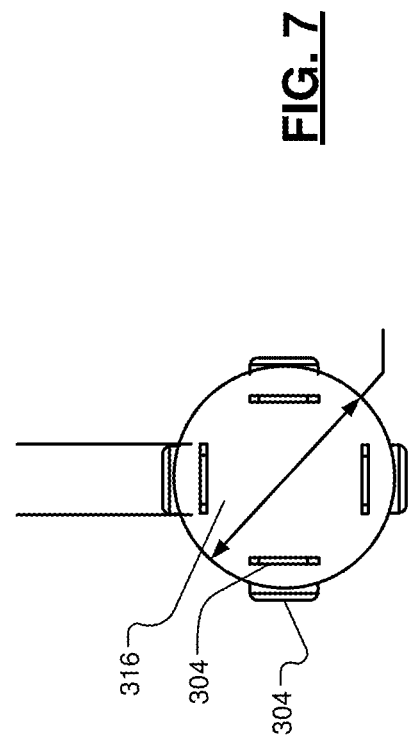
FIG. 7 includes a perspective view toward second ends of the electrical conductors of the connector.
Figure 5:
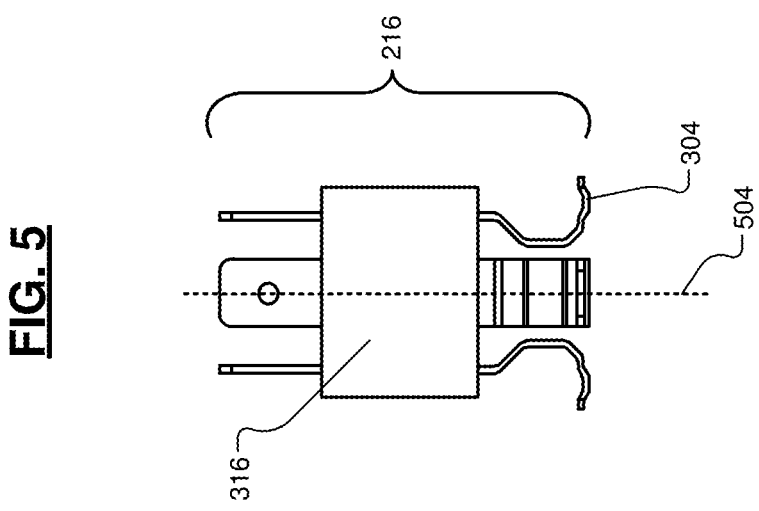
FIG. 5 includes a perspective side view of a connector including electrical conductors and a retainer.

FIG. 5 is a perspective side view of the connector 216 including the electrical conductors 304 and the retainer 316. FIG. 6 includes a perspective view toward the first ends of the electrical conductors 304. FIG. 7 includes a perspective view toward the second ends of the electrical conductors. As shown in FIGS. 6 and 7, the electrical conductors 304 may be rotated approximately 90 degrees from each other.

Figure 8:
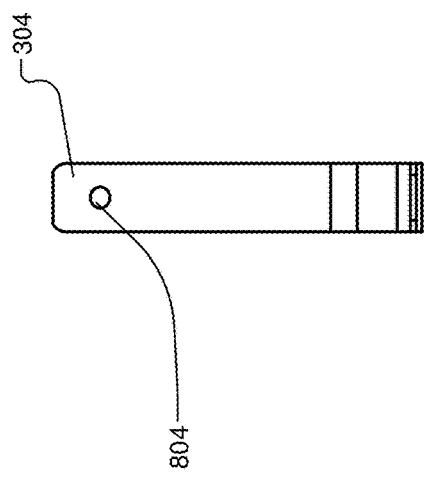
FIG. 8 includes a perspective view of one of the electrical conductors.

FIG. 8 includes a perspective view of one of the electrical conductors 304. In various implementations, each of the electrical conductors 304 may include a through hole 804 located a predetermined distance from its second end. An electrical conductor of one of the wires 212 may be inserted through the through hole 804 before the electrical conductor of that one of the wires 212 is electrically coupled to that one of the electrical conductors 304. Each of the other ones of the electrical conductors 304 and the connections to the other ones of the wires 212 may be the same.

Figure 10:
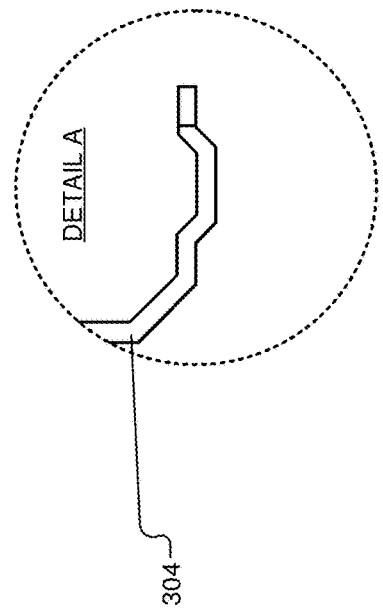
Figure 9:
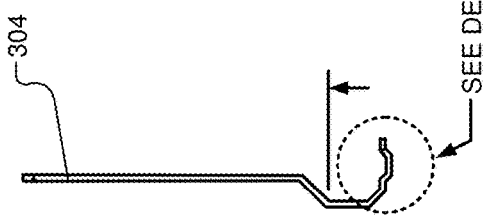
FIG. 9 includes a perspective side view of the one of the electrical conductors.

FIG. 9 includes another perspective side view of one of the electrical conductors 304. FIGS. 10 and 11 include a perspective side view including the first end of one of the electrical conductors 304.

As shown in FIG. 11, the first end of the one of the electrical conductors 304 may include a first flat portion 1104 configured to contact one of the electrically conductive pads 220. The one of the electrical conductors 304 may also include at least one of a second flat portion 1108 and a third flat portion 1112 that is/are parallel to the first flat portion 1104. A first angled portion 1116 may connect the first flat portion 1104 with the second flat portion 1108. A second angled portion 1120 may connect the first flat portion 1104 with the third flat portion 1112. Each of the other ones of the electrical conductors 304 may be the same. While an example shape of the first end is provided, the present disclosure is also applicable to other shapes. As shown in FIG. 5, the electrical conductors 304 may extend radially inwardly (relative to the second ends) toward an axis 504 through the retainer 316.

The retainer 316 may be a single piece or may include multiple pieces that form the retainer 316. The retainer 316 may be cylindrical and have a predetermined retainer diameter that is less than the predetermined through hole diameter of the through hole 208.

Figure 12:
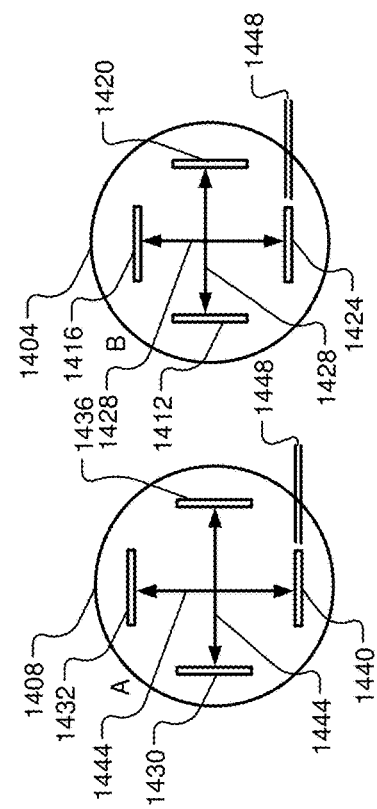
FIG. 12 includes a cross-sectional view of a retainer including a first retainer disc, a second retainer disc, and a third retainer disc.
Figure 13:
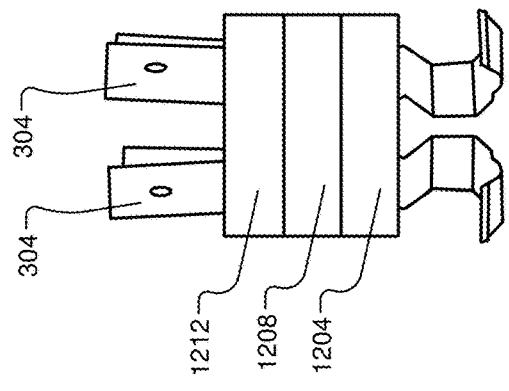
FIG. 13 includes an example perspective view of the retainer including the first retainer disc, the second retainer disc, and the third retainer disc.

Examples of the retainer 316 including multiple pieces are provided in FIGS. 12 and 13. FIG. 12 includes a cross-sectional view of the retainer 316 including a first retainer disc 1204, a second retainer disc 1208, and a third retainer disc 1212. FIG. 13 includes an example perspective view of the retainer 316 including the first retainer disc 1204, the second retainer disc 1208, and the third retainer disc 1212.

As shown in the example of FIG. 12, the first retainer disc 1204 may be the same as the third retainer disc 1212, and the second retainer disc 1208 may be different than the first and third retainer discs 1204 and 1212. The first, second, and third retainer discs 1204, 1208, and 1212 may be made of ceramic, epoxy, or another suitable material. While the example of three retainer discs is provided, the retainer 316 may include two or more than three retainer discs.

Figure 14:
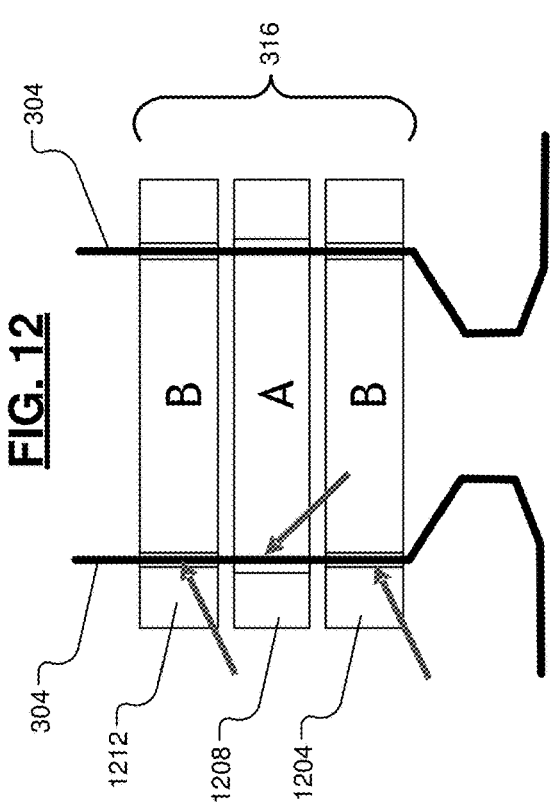
FIG. 14 includes a perspective view of example retainer discs.

FIG. 14 includes a perspective view of example retainer discs. As shown in FIGS. 12 and 14, the first and third retainer discs 1204 and 1212 may be a first type of cylindrical retainer disc 1404 (B) and the second retainer disc 1208 may be a second type of cylindrical retainer disc 1408 (A). The second retainer disc 1208 is sandwiched between the first and third retainer discs 1204 and 1212. Diameters of the first and second types of retainer discs 1404 and 1408 may be equal.

The first type of retainer disc 1404 has first, second, third, and fourth apertures 1412, 1416, 1420, and 1424. Opposite ones of the first, second, third, and fourth apertures 1412, 1416, 1420, and 1424 are separated by a first predetermined distance 1428. In other words opposite ones of the first, second, third, and fourth apertures 1412, 1416, 1420, and 1424 have a first predetermined pitch.

The second type of retainer disc 1408 has fifth, sixth, seventh, and eighth apertures 1430, 1432, 1436, and 1440. Opposite ones of the fifth, sixth, seventh, and eighth apertures 1430, 1432, 1436, and 1440 are separated by a second predetermined distance 1444. In other words opposite ones of the fifth, sixth, seventh, and eighth apertures 1430, 1432, 1436, and 1440 have a second predetermined pitch. The second predetermined distance 1444 is greater than the first predetermined distance 1428, and the second predetermined pitch is greater than the first predetermined pitch. For example only, the first predetermined distance 1428 may be approximately 2.6 mm or another suitable distance, and the second predetermined distance may be approximately 2.8 mm or another suitable distance.

Dimensions of the first, second, third, fourth, fifth, sixth, seventh, and eighth apertures 1412, 1416, 1420, 1424, 1430, 1432, 1436, and 1440 may be equal. The second predetermined distance 1444 may be greater than the first predetermined distance 1428 by at least a width 1448 of the apertures or at least twice the width 1448 of the apertures. The apertures may be formed, for example, using laser cutting or another type of machining.

The electrical conductors 304 extend through the apertures of the first, second, and third retainer discs 1204, 1208, and 1212 as shown in FIG. 12. The first and second distances 1428 and 1444 being different imposes a force against sides of the electrical conductors 304 and retains the electrical conductors 304 within the connector 216 without the electrical conductors being bonded to the first, second, or third retainer discs 1204, 1208, and 1212. While the example of the second type of cylindrical retainer disc 1408 being sandwiched between two of the first type of cylindrical retainer disc 1404 is provided, the present disclosure is also applicable to the first type of cylindrical retainer disc 1404 being sandwiched between two of the second type of cylindrical retainer disc 1408.

FIG. 15 includes a cross-sectional view of the electrical conductors 304 and a first retainer disc 1504. The electrical conductors 304 are bonded to the first retainer disc 1504 using an adhesive 1508, such as an epoxy or a glue (e.g., super glue). The adhesive 1508 may be dispensed, for example, using a syringe 1512, a toothpick, or another type of dispenser or applicator.

The first retainer disc 1504 may be bonded to the electrical conductors 304 while the first ends of the electrical conductors 304 rest on a surface 1516, as illustrated in FIG. 15. Alternatively, the first retainer disc 1504 may be bonded to the electrical conductors 304 while the second ends of the electrical conductors 304 rest on a surface. In various implementations, the first retainer disc 1504 may be the first type of cylindrical retainer disc 1404 or the second type of cylindrical retainer disc 1408.

Alternatively, the first retainer disc 1504 may be configured to bond the electrical conductors 304 with the first retainer disc 1504. FIG. 16 includes a perspective view of another example of the first retainer disc 1504. The first retainer disc 1504 may include ninth, tenth, eleventh, and twelfth apertures 1604, 1608, 1612, and 1616. The ninth, tenth, eleventh, and twelfth apertures 1604, 1608, 1612, and 1616 may each include a circular (cylindrical) portion 1620 for the adhesive 1508. A diameter of the circular portions 1620 may be approximately 0.5 mm or another suitable diameter. The adhesive 1508 may be applied within one, more than one, or all of the apertures of the first retainer disc 1504.

Two or more other retainer discs may be added to form the retainer 316. The two or more other retainer discs may be, for example, the same as the first retainer disc 1504. While the example of bonding the electrical conductors 304 with the first retainer disc 1504 is provided, the electrical conductors 304 may additionally or alternatively be bonded to one or more other retainer discs.

Figure 17:
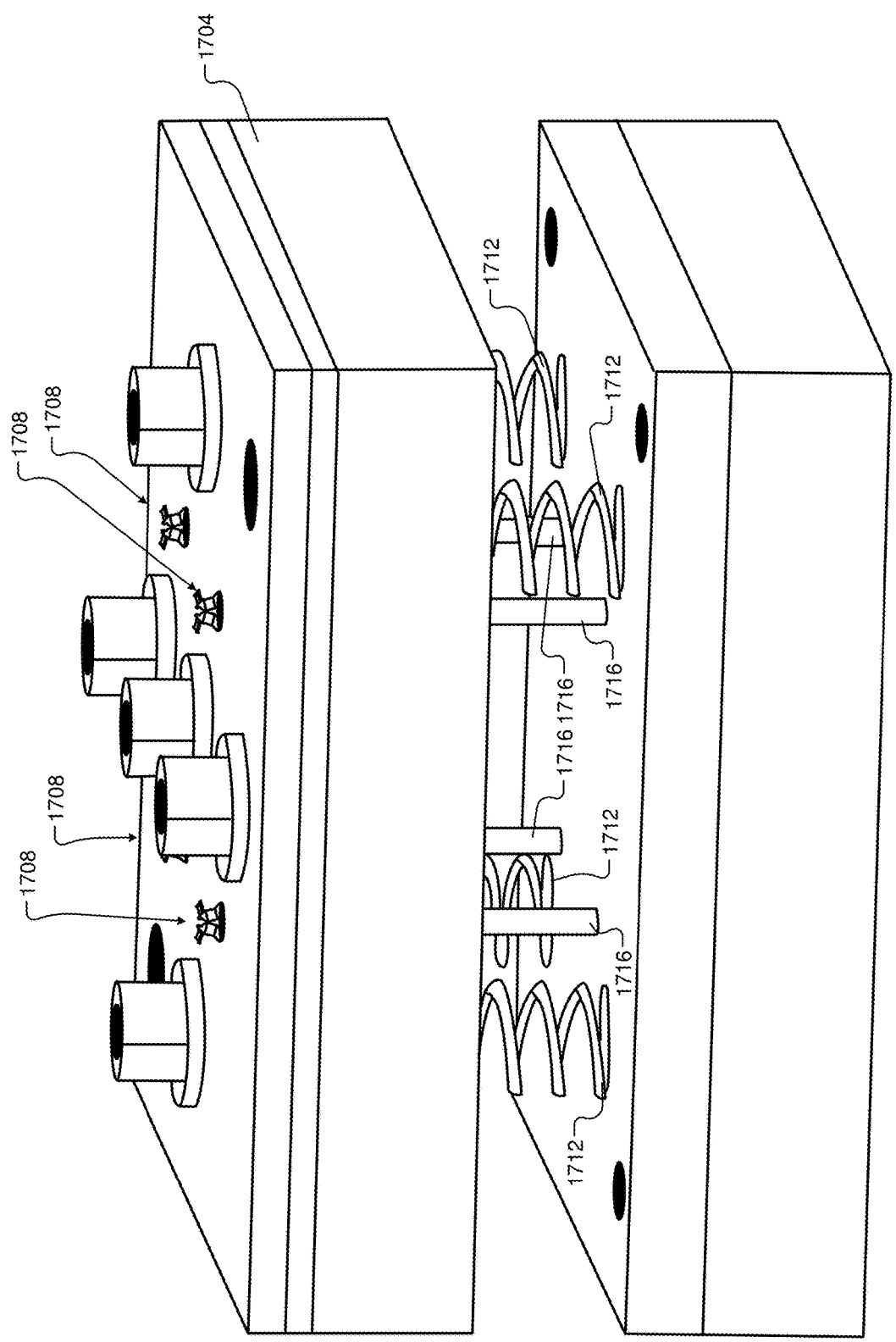
FIG. 17 includes a perspective view of an example potting fixture including multiple connectors with single piece retainers.
Figure 18:
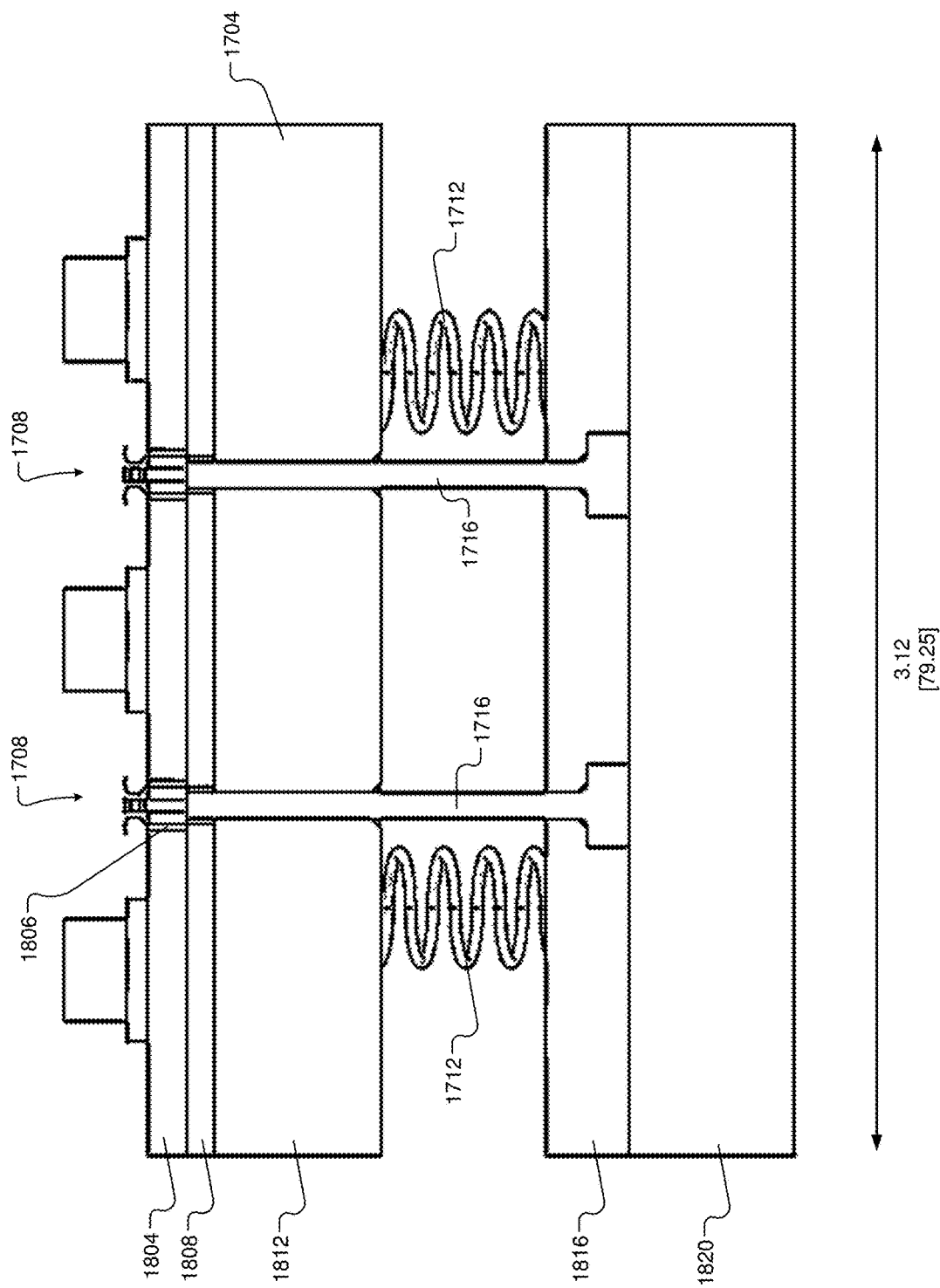
FIG. 18 includes a cross-sectional view of the potting fixture.

In the example of the retainer 316 being a single piece, the retainer 316 may be formed using potting and a potting fixture. FIG. 17 includes an example potting fixture generally illustrated by 1704 including multiple connectors 1708 with single piece retainers. FIG. 18 includes an example cross-sectional view of the potting fixture 1704.

The potting fixture 1704 may include, for example, Teflon or another material that the material of the retainer 316 will not adhere to. Once electrical conductors for each of the connectors 1708 are inserted into the potting fixture 1704, the material (e.g., epoxy) of the retainer 316 may be added to the potting fixture 1704 to form the retainers of the connectors 1708. An example epoxy includes SUP12APHT-LO by Master Bond. The potting fixture 1704 may include one or more springs 1712 and posts 1716 that facilitate ejection of the connectors 1708 from the potting fixture 1704.

As shown in FIG. 18, the potting fixture 1704 may include a well plate 1804 with apertures (or wells) 1806 for the retainers of the connectors 1708. For example only, the well plate 1804 may be approximately 0.12 inches (3 mm) thick or another suitable thickness. The wells 1806 may be provided with a predetermined draft (e.g. 1 degree draft), for example, to facilitate ejection of the connectors 1708 from the potting fixture 1704.

A connector retainer plate 1808 may include apertures that the electrical conductors are inserted into. For example only, the connector retainer plate 1808 may be approximately 0.08 inches (2 mm) thick or another suitable thickness. The springs 1712 may be disposed between upper and lower stop plates 1812 and 1816. For example only, the upper stop plate 1812 may be approximately 0.5 inches (12.7 mm) thick or another suitable thickness. For example only, the lower stop plate 1816 may be approximately 0.25 inches (6.35 mm) thick or another suitable thickness. The potting fixture 1704 may also include a baseplate 1820. For example only, the baseplate 1820 may be approximately 0.5 inches (12.7 mm) thick or another suitable thickness.

When the springs 1712 are in an extended state (e.g., as in the example of FIG. 18), the posts 1716 may extend through the upper stop plate 1812, the lower stop plate 1816, and the connector retainer plate 1808. When the springs 1712 are in a compressed state, the posts 1716 extend through the well plate 1804 and eject the connectors 1708 from the well plate 1804 and the connector retainer plate 1808.

Figure 19:
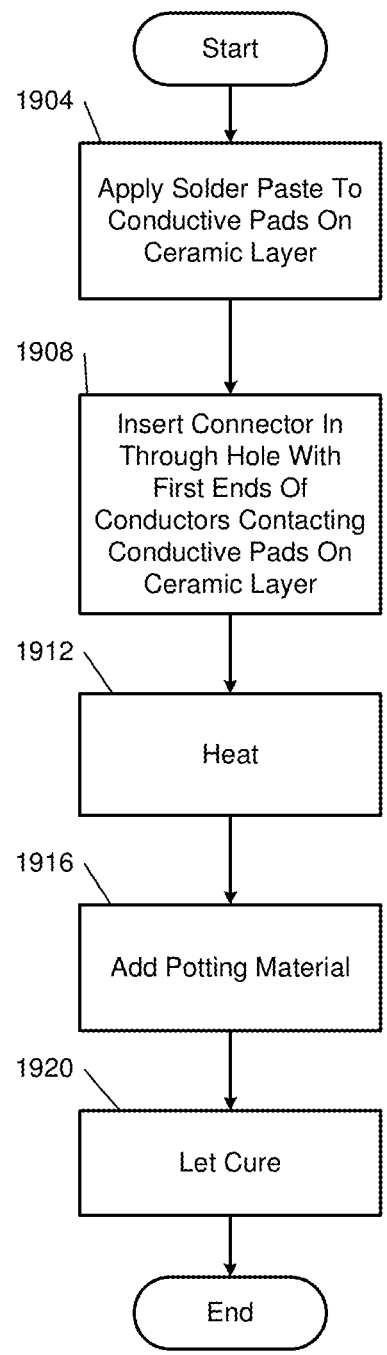
FIG. 19 includes a flowchart depicting an example method of electrically connecting temperature sensors with temperature controller through a through hole in a substrate support using a connector.

FIG. 19 includes a flowchart depicting an example method of electrically connecting the temperature sensors 204 with the temperature controller 142 using the connector 216. Control begins with 1904 where a solder paste (e.g., a paste of solder and flux) is applied to the electrically conductive pads 220 formed on the ceramic layer 112 of the substrate support 106. The substrate support 106 may be flipped vertically relative to the orientation shown in the example of FIG. 2. At 1904, the wires 212 may already be electrically connected to the respective second ends of the electrical conductors 304 of the connector 216, and the other ends of the wires 212 may be electrically connected to the temperature controller 142. Alternatively, the wires 212 may be electrically connected to the temperature controller 142 and/or the second ends of the electrical conductors 304 of the connector 216 at a later time (e.g., after 1920).

At 1908, the connector 216 is inserted into the through hole 208 such that the first ends of the electrical conductors 304 directly and respectively contact at least one of the electrically conductive pads 220 and the solder paste. At 1912, heat may be applied to reflow solder the first ends of the electrical conductors 304 to the electrically conductive pads 220, respectively. At 1916, the potting material 308 may be added via the through hole 208 in contact with the first ends of the electrical conductors 304 and the surface of the ceramic layer 112. At 1920, the potting material 308 is cured, such as via applying heat and/or allowing the potting material 308 to sit.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C." As used herein, approximately may mean +/−10 percent.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support for a plasma system, the substrate support comprising:
    a first layer being made of a ceramic and having a first surface and a second surface opposite the first surface, the first layer configured to support a substrate on the first surface during processing;
    a thermal heating element that is embedded within the ceramic;
    a temperature sensor that is embedded within the ceramic;
    electrically conductive pads that are:
        electrically connected to the temperature sensor via first es embedded in the ceramic; and
        formed on the second surface of the first layer; and
    a second layer that includes a through hole through the second layer;
    a connector that extends through the through hole and that includes:
        a retainer; and
        electrical conductors that are held by the retainer and that include:
            first ends that are electrically connected to the electrically conductive pads, respectively; and
            second ends that are electrically connected to a temperature controller by wire.

2. The substrate support of claim 1 wherein the first ends are electrically connected to the electrically conductive pads, respectively, via reflow soldering.

3. The substrate support of claim 1 wherein the retainer is a single piece.

4. The substrate support of claim 3 wherein the retainer is made of an epoxy.

5. The substrate support of claim 3 wherein the retainer is made of one of silicone, polytetrafluoroethylene (PTFE), polyether ether ketone (PEEK), and a ceramic.

6. The substrate support of claim 1 wherein the retainer includes:
    a first cylindrical disc;
    a second cylindrical disc; and
    a third cylindrical disc,
    wherein the electrical conductors extend through the first, second, and third cylindrical discs, and
    wherein the second cylindrical disc is sandwiched between the first and third cylindrical discs.

7. The substrate support of claim 6 further comprising an adhesive that adheres the electrical conductors to at least one of the first, second, and third cylindrical discs.

8. The substrate support of claim 6 wherein:
    the first cylindrical disc includes first apertures that are separated by a first distance;
    the second cylindrical disc includes second apertures that are separated by a second distance,
    wherein the second distance is either greater than the first distance or less than the first distance; and
    the third cylindrical disc includes third apertures that are separated by the first distance.

9. The substrate support of claim 6 wherein the first, second, and third cylindrical discs are made of ceramic.

10. The substrate support of claim 6 wherein the first, second, and third cylindrical discs are made of one of an epoxy, silicone, polytetrafluoroethylene (PTFE), and polyether ether ketone (PEEK).

11. The substrate support of claim 6 further comprising potting material, wherein the first ends are potted within the potting material.

12. The substrate support of claim 1 wherein the first ends of the electrical conductors extend radially outwardly from an axis of the retainer.

13. The substrate support of claim 1 further comprising:
    a second temperature sensor that is embedded within the ceramic,
    wherein the electrically conductive pads are electrically connected to the second temperature sensor via second wires embedded in the ceramic.

14. The substrate support of claim 1 wherein the temperature sensor is an inter-integrated circuit (I2C) temperature sensor.

15. The substrate support of claim 14 wherein:
    the electrically conductive pads include a first electrically conductive pad, a second electrically conductive pad, a third electrically conductive pad, and a fourth electrically conductive pad; and
    the electrical conductors include:
        a first electrical conductor that is electrically connected to the first electrically conductive pad via reflow soldering;
        a second electrical conductor that is electrically connected to the second electrically conductive pad via reflow soldering;
        a third electrical conductor that is electrically connected to the third electrically conductive pad via reflow soldering; and
        a fourth electrical conductor that is electrically connected to the fourth electrically conductive pad via reflow soldering.

16. The substrate support of claim 15 wherein the first, second, third, and fourth electrical conductors are rotated 90 degrees from each other.

17. The substrate support of claim 1 further comprising the temperature controller, wherein the temperature controller is configured to control heating of the thermal heating element based on a temperature measured by the temperature sensor.

18. The substrate support of claim 1 wherein the first ends include first portions that directly contact the electrically conductive pads, respectively, and second portions that are parallel to the first portions and that do not directly contact the electrically conductive pads.

* * * * *

UNITED STATES PATENT AND TRADEMARK OFFICE
CERTIFICATE OF CORRECTION

| | |
|---|---|
| PATENT NO. | : 10,851,458 B2 |
| APPLICATION NO. | : 15/936990 |
| DATED | : December 1, 2020 |
| INVENTOR(S) | : Siyuan Tian et al. |

It is certified that error appears in the above-identified patent and that said Letters Patent is hereby corrected as shown below:

In the Claims

Claim 1, Column 13, Line 45, delete "es" and insert --wires-- therefor.

Signed and Sealed this
Twenty-fifth Day of April, 2023

Katherine Kelly Vidal
*Director of the United States Patent and Trademark Office*